(12) United States Patent
Saloio, Jr. et al.

(10) Patent No.: US 9,450,284 B2
(45) Date of Patent: Sep. 20, 2016

(54) RESONANCE BASED CABLE COMPENSATION

(71) Applicant: Hamilton Sundstrand Corporation, Charlotte, NC (US)

(72) Inventors: James Saloio, Jr., Ludlow, MA (US); Ronald D. Poisson, Longmeadow, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 608 days.

(21) Appl. No.: 13/932,539

(22) Filed: Jul. 1, 2013

(65) Prior Publication Data

US 2015/0002245 A1  Jan. 1, 2015

(51) Int. Cl.
| | |
|---|---|
| H01H 19/64 | (2006.01) |
| H01P 7/00 | (2006.01) |
| G01R 27/26 | (2006.01) |
| G01R 35/00 | (2006.01) |
| G01R 31/28 | (2006.01) |
| G01R 1/24 | (2006.01) |

(52) U.S. Cl.
CPC ............... *H01P 7/00* (2013.01); *G01R 27/26* (2013.01); *G01R 31/2829* (2013.01); *G01R 35/005* (2013.01); *G01R 1/24* (2013.01)

(58) Field of Classification Search
CPC ... H01P 7/00; G01R 31/2829; G01R 35/005; G01R 1/24; G01R 27/26
See application file for complete search history.

(56) References Cited

U.S. PATENT DOCUMENTS

| | | | | |
|---|---|---|---|---|
| 2008/0265910 | A1* | 10/2008 | Gasperi | G01R 27/04 324/629 |
| 2012/0194201 | A1* | 8/2012 | Saloio | G01R 27/26 324/537 |

* cited by examiner

*Primary Examiner* — Daniel Cavallari
(74) *Attorney, Agent, or Firm* — Locke Lord LLP; Scott D. Wofsy; Joshua L. Jones

(57) ABSTRACT

A system for resonance based cable compensation includes a first switch with a first terminal for connecting a first connection of a cable having a resonant circuit on an end of the cable opposite the first switch. The system also includes a second terminal for connecting a second connection of a cable that has its first connection connected to the first terminal. A logic component is operatively connected to control the first switch to selectively apply voltage pulses across the first and second terminals to generate a resonance signal in a cable connected to the terminals in order to compensate for equivalent cable capacitance.

20 Claims, 3 Drawing Sheets

RESONANCE BASED CABLE COMPENSATION

BACKGROUND OF THE INVENTION

1. Field of the Invention

The present invention relates to cables, and more particularly to cables for carrying signals, for example from remote sensors.

2. Description of Related Art

Cables such as coaxial cables, twisted shielded cables, or the like, are commonly used to carry signals. For example, in systems using tuned resonant sensors, a cable can connect between a remote sensor and a diagnostic or control system. Various errors can occur in such systems. Various approaches have been taken to address some types of errors. For example, commonly assigned U.S. Patent Application Publication No. 2012/0194201, which is incorporated by reference herein in its entirety, describes solutions for frequency based fault detection.

Many common sensors and systems, such as RTDs, LVDTs, and resolvers, are sensitive to errors introduced due to the effects of the cable/harness. Resonant based inductive sensors, for example knock sensors, eddy current sensors or oil debris sensors, may be particularly sensitive to shifts in resonance due to cable capacitance. It is common for control systems to compensate for the cable error if the cable type and length are fixed, thus, controlling the resulting cable parasitic that causes the error. For a resonant based sensor, a typical compensation method is to tune the resonance to the known cable length or to calibrate accordingly. However, it is a more difficult problem to compensate for the error if the cable type or length changes for different system installations.

Such conventional methods and systems have generally been considered satisfactory for their intended purpose. However, there is still a need in the art for systems and methods that allow for improved compensation for cable/harness effects. There also remains a need in the art for such systems and methods that are easy to make and use. The present invention provides a solution for these problems.

SUMMARY OF THE INVENTION

A new and useful system for resonance based cable compensation includes a first switch with a first terminal for connecting a first connection of a cable having a resonant circuit on an end of the cable opposite the first switch. The system also includes a second terminal for connecting a second connection of a cable that has its first connection connected to the first terminal. A logic component is operatively connected to control the first switch to selectively apply voltage pulses across the first and second terminals to generate a resonance signal in a cable connected to the terminals in order to compensate for equivalent cable capacitance.

A second optional switch can connect between the second terminal and the logic component so both switches must be closed in order to excite the resonant circuit. The logic component can include a switch enabler connected to control the first switch, and another switch enabler to control the second switch if applicable.

In accordance with certain embodiments, the logic component includes a pulse counter operatively connected to the first terminal to count pulses at the first terminal. The logic component can include a timer operatively connected to time output pulses from the switch enabler and feedback pulses from the first terminal.

The system can include a system processor operatively connected to the logic component and a signal conditioning component operatively connected to the system processor. The system processor and the signal conditioning component are configured and adapted to compensate for cable capacitance in signals from a cable connected to the first and second terminals based on input from the logic component. A comparator can be operatively connected to the first terminal and pulse counter to convert sinusoidal signal wave forms received at the first terminal into square signal waveforms to be counted by the pulse counter.

Another exemplary resonance based compensated cable system includes a resonant circuit, such as a resonant sensor circuit, and a cable connected at a first end of the cable to apply a voltage across the resonant circuit. The cable is connected at a second cable end to the first and second terminals of a system for resonance based cable compensation as described above in order to excite the resonant circuit. A system processor can be operatively connected to the digital logic component and a signal conditioning component can be operatively connected to the system processor. The system processor and the signal conditioning component can be configured and adapted to compensate for cable capacitance in signals from a second cable connected to first and second terminals of the signal conditioning component, based on input from the digital logic component, wherein the second cable is different from the cable connected to the first and second terminals.

A new and useful method of cable compensation includes applying an excitation pulse across two connections of a first end of a cable having a resonant circuit at a second end of the cable to generate a resonating signal from the connections of the first end of the cable. The method also includes determining cable capacitance based on the resonating signal and processing a sensor signal, compensating for the cable capacitance.

In certain embodiments, compensating for the cable capacitance includes adjusting operating frequency for the resonant circuit. Processing a sensor signal can include processing a sensor signal from the resonant circuit. It is also contemplated that processing a sensor signal can include processing a sensor signal from a sensor connected to a second cable of similar configuration to the cable having the resonant circuit. Applying a pulse across two connections of a first end of a cable can include periodically applying a pulse to generate the resonating signal periodically for a number of pulses. It is also contemplated that determining cable capacitance can include determining an average frequency of the resonating signal for the number of pulses.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods described herein without undue experimentation, preferred embodiments thereof will be described in detail herein below with reference to certain figures, wherein.

DETAILED DESCRIPTION OF THE PREFERRED EMBODIMENTS

Figure 1:
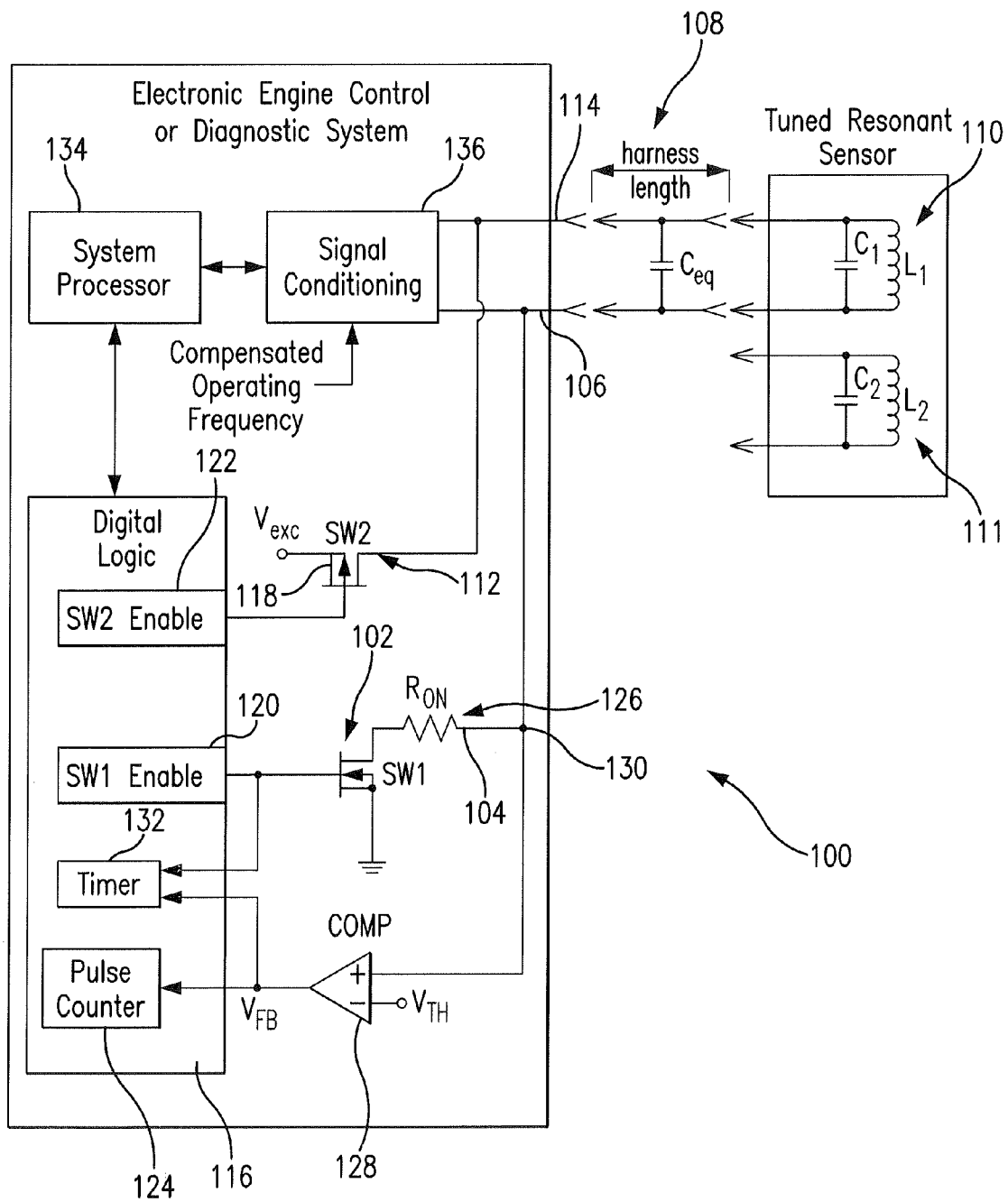
FIG. 1 is a schematic view of an exemplary embodiment of a system for resonance based cable compensation, showing a configuration for use with a cable connected to a tuned resonant sensor, wherein the cable capacitance can be determined to compensate therefore.

Reference will now be made to the drawings wherein like reference numerals identify similar structural features or aspects of the subject invention. For purposes of explanation and illustration, and not limitation, a partial view of an exemplary embodiment of a system for resonance based cable compensation is shown in FIG. 1 and is designated generally by reference character 100. Other embodiments of systems and methods for cable compensation, or aspects thereof, are provided in FIGS. 2-4, as will be described. The systems and methods described herein can be used, for example, in compensating for sensor system installation errors introduced by harness/cable effects.

System 100 includes a first switch 102 with a first terminal 104 for connecting a first connection 106 of a harness or cable 108 having a resonant circuit 110 on the opposite end of cable 108. First terminal 104 includes a resistor 126 for controlling or limiting the maximum excitation current flowed to the resonant circuit. The system also includes a second terminal 112 for connecting a second connection 114 of cable 108 to system 100. A logic component, namely digital logic 116, is operatively connected to control switch 102 to selectively apply voltage pulses across the first and second terminals 104 and 112 to generate a resonance signal in cable 108 in order to compensate for equivalent cable capacitance.

With continued reference to FIG. 1, a second optional switch 118 selectively connects between second terminal 112 and digital logic 116 so that both switches 102 and 118 must be closed to apply voltage pulses across terminals 104 and 112 to generate resonant a resonant signal in cable 108 to compensate for cable capacitance. Digital logic 116 includes switch enablers 120 and 122 each respectively connected to control the first and second switches 102 and 118. Digital logic 116 can be in the form of a field programmable gate array (FPGA), a digital signal processor (DSP), microcontroller, or any other suitable form.

A comparator 128 is connected in series between first terminal 104 and pulse counter 124. Comparator 128 is therefore connected to convert sinusoidal signal wave forms received at first terminal 104, or more specifically at node 130, into square signal waveforms to be counted by pulse counter 124. Digital logic 116 includes a pulse counter 124 operatively connected to first terminal 104 to count falling (or rising) edges of pulses from the output of comparator 128. Digital logic 116 also includes a timer 132 operatively connected to time output pulses from switch enabler 120 and feedback pulses from first terminal 104, by way of comparator 128.

With continued reference to FIG. 1, system 100 includes a system processor 134 operatively connected to digital logic 116 and a signal conditioning component 136 operatively connected to system processor 134. In addition to exciting and measuring the sensor signal, system processor 134 and signal conditioning component 136 are configured and adapted to compensate for cable capacitance in signals from cable 108 connected to first and second terminals 104 and 112 based on input from digital logic 116.

System 100, cable 108, and resonant circuit 110, which can be a tuned resonant circuit, for example, for a resonance based compensated cable system. Switch 118 has a terminal connected to a voltage $V_{exc}$, and switch 102 has a terminal connected to ground. $V_{exc}$ can be a DC voltage supply such as a +15 V dc or similar source, and the ground connection can be a −15V negative supply instead of ground, for example. Resonant circuit 110 is connected at one end of cable 108. Cable 108 is connected at its opposite end to the first and second terminals 104 and 112 to apply a voltage $V_{exc}$ across resonant circuit 110 when both switches 102 and 108 are closed.

Optionally, additional sensor circuits can be included, e.g., resonant circuit 111, and each can have its own cable. As long as the additional cables are of similar length and type to cable 108, a single compensation based on resonant circuit 110 can be used for all of the cables. $L_1$ and $C_1$ should be at least roughly known based on the tuned resonant sensor design in order to correctly design the digital compensation timer and switch to turn on time $T_1$ and other parameters as described below. But for the example in FIG. 1, the main compensation purpose is to determine the true resonant frequency with the installation/application specific cable length.

Figure 2:
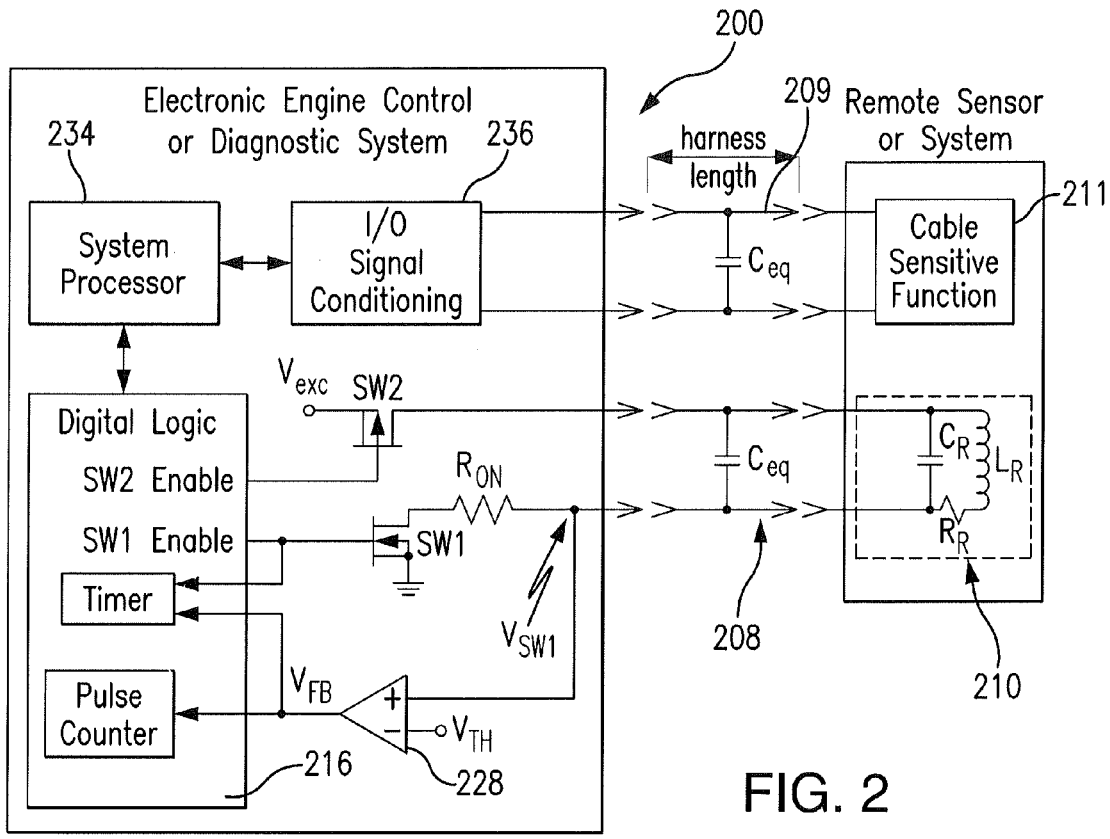
FIG. 2 is a schematic view of an exemplary embodiment of a system for resonance based cable compensation, showing a configuration with a sensor connected to a first cable, with a second cable connected to a resonant circuit, wherein the cable capacitance can be determined for the second cable to compensate for capacitance in the first cable.

Referring now to FIG. 2, another exemplary system 200 is shown which uses two cables 208 and 209. Cable 208 is connected at one end to a reference resonant circuit 210. At its opposite end, cable 208 is connected to first and second switches, a comparator 228, and digital logic 216 in the same manner as cable 108 described above, except that cable 208 is not also directly connected to signal conditioning component 236. System processor 234 and signal conditioning component 236 are connected to digital logic 216 and to cable 209 to compensate for cable capacitance in signals from cable 209, which is connected to first and second terminals of signal conditioning component 236. The compensation is based on input from digital logic 216 derived from cable 208 and resonant circuit 210. Although cable 209 is a different cable from cable 208, as long as cable 209 is of a similar type and length to cable 208, it will have the same cable capacitance $C_{eq}$. Therefore digital logic 216 can allow for compensation for cable 209 based on the input derived from cable 208. In this way, cable sensitive sensor 211 does not necessarily have to be a resonant type circuit. System 200 can therefore be used for cable compensation in general applications. Generally, the approach assumes that the cable lengths and types are the same but the length is unknown. $L_r$ and $C_r$ need to be known reference values used to compute $C_{eq}$. Here, the cable type and capacitance per length would be known but the cable length varies depending on the application or installation.

In applications where cables 208 and 209 are of different lengths, cable capacitance $C_{eq}$ of cable 208 can be divided by the length of cable 208. This capacitance per length can be used to estimate the capacitance $C_{eq}$ of cable 209, to allow for appropriate compensation in order to reduce or eliminate cable based error, as long as the difference between cable lengths is known.

Another example is where the cable lengths are the same and the cables are of two different but known types. The reference cable can be used to determine the cable length and, if necessary, the cable capacitance of the other cable or cables can be estimated based on the known capacitance per length of each.

Another example is for the case where the cable sensitive function is a two wire RTD sensor. Two wire RTDs are sensitive to cable resistance which increases with increasing cable length. This approach could be used to automatically determine the length of the cable and then compute the nominal cable resistance (via resistance per length) for subsequent RTD cable compensation.

Another example is a communication link or timing signal where the propagation delay of the signal is a significant error source so that determining the cable length can be used to calibrate out the propagation delay. An advantage here is that system software can self-determine the cable length (or cable capacitance) so that different installations would not require different software cable length trim constants to calibrate out cable errors.

While described above in the exemplary context of two cables where a single compensation is used for both cables, those skilled in the art will readily appreciate that a single compensation can be used for any multiple of cable sensitive functions, such as in a remote sensor or system. A single reference $L_r$, $C_r$ resonant circuit can be used to compensate one or more sensor functions that are sensitive to unknown cable length, assuming all the relevant cable lengths are the same.

Figure 3:
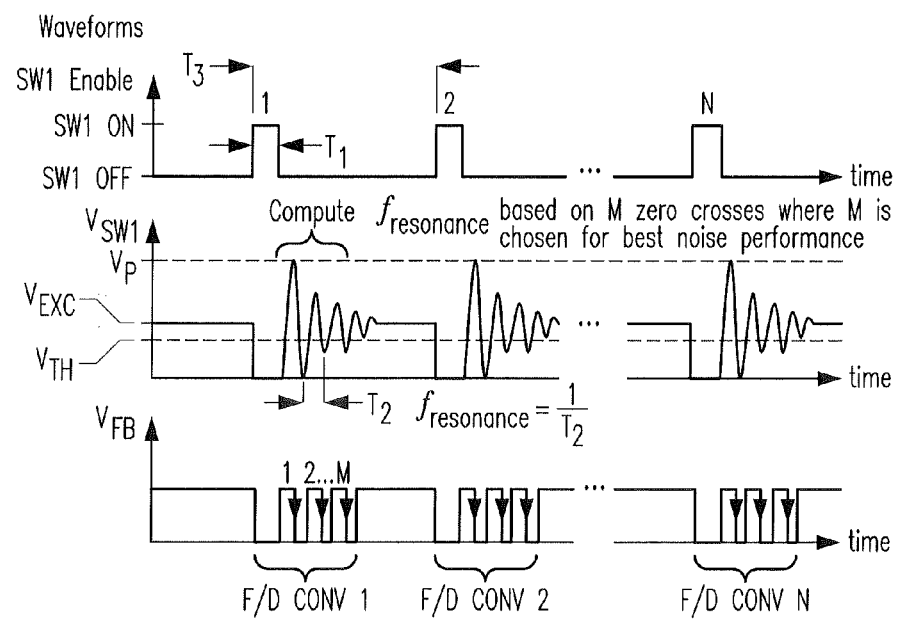
FIG. 3 is a set of related waveform graphs for the systems of FIGS. 1 and 2, showing the excitation pulses, the resonant response, and the square waves for calculating frequency.

With reference to FIG. 3, the operation of systems 100 and 200 is described with reference to the waveforms at certain points in the system. The top graph in FIG. 3 shows the pulsing on and off of switch 102. These pulses are of duration $T_1$, where $T_1$ is chosen such that $V_P$, the peak voltage in the middle graph of FIG. 3, does not become clipped by breaking down switch 102 or by a clamping device such as a transient voltage suppressor. This operation of switch 102 generates the resonating signal from the connections of the first end of the cable, producing a damped sinusoidal waveform at node 130, which is shown in FIG. 1. $V_{TH}$ is the threshold voltage for comparator 128, and is indicated with a dashed line in the middle graph of FIG. 3. The bottom graph in FIG. 3 shows the square waves output by comparator 128 to pulse counter 124. M periods of the square waves are used where M is chosen based on having sufficient signal to noise ratio at the comparator input as the damped sinusoid amplitude decays. Timing of the M pulses yields the resonance frequency $f_r$, which allows for the equation:

$$f_r = \frac{1}{2\pi\sqrt{L_1(C_1 + C_{eq})}}$$

to be solved for $C_{eq}$ given $C_1$ and $L_1$ are known quantities for resonant circuit 110. Switch 102 can be pulsed periodically, applying a pulse to generate the resonating signal periodically for a number N of pulses. The time $T_3$ between enabling pulses is chosen based on the sinusoidal decay time such that the re-enabling of switch 102 occurs after the prior resonant sinusoid has decayed to a near zero amplitude. Resonance frequency $f_r$ can be averaged over N pulses to increase accuracy in determining $C_{eq}$.

Thus cable capacitance $C_{eq}$ is determined based on the resonating signal to allow for processing a sensor signal with compensation for the cable capacitance. The compensation can be accomplished, for example, by adjusting operating frequency for the resonant circuit in a system such as system 100 in FIG. 1. Once the compensation is set, the system can begin processing sensor signals, e.g., from resonant circuit 110 or sensor 211.

During normal use, the sensor signal from resonant circuit 110 is processed by the signal processing block at a fixed operating frequency. Sensor 110 is tuned for operation at a resonant frequency. This resonant frequency is shifted due to the cable capacitance $C_{eq}$, which is a function of cable/harness length, cable type, and manufacturing tolerances. The sensor inductance $L_1$ and capacitance $C_1$ are also affected by manufacturing variation and temperature. The switches, comparator, and digital logic described herein can be used to measure the true sensor resonant operating frequency as installed in a system and including the harness. The processor system can measure the system resonance and compensate for the shift from nominal by, for example, changing the operating frequency to the measured resonance.

Figure 4:
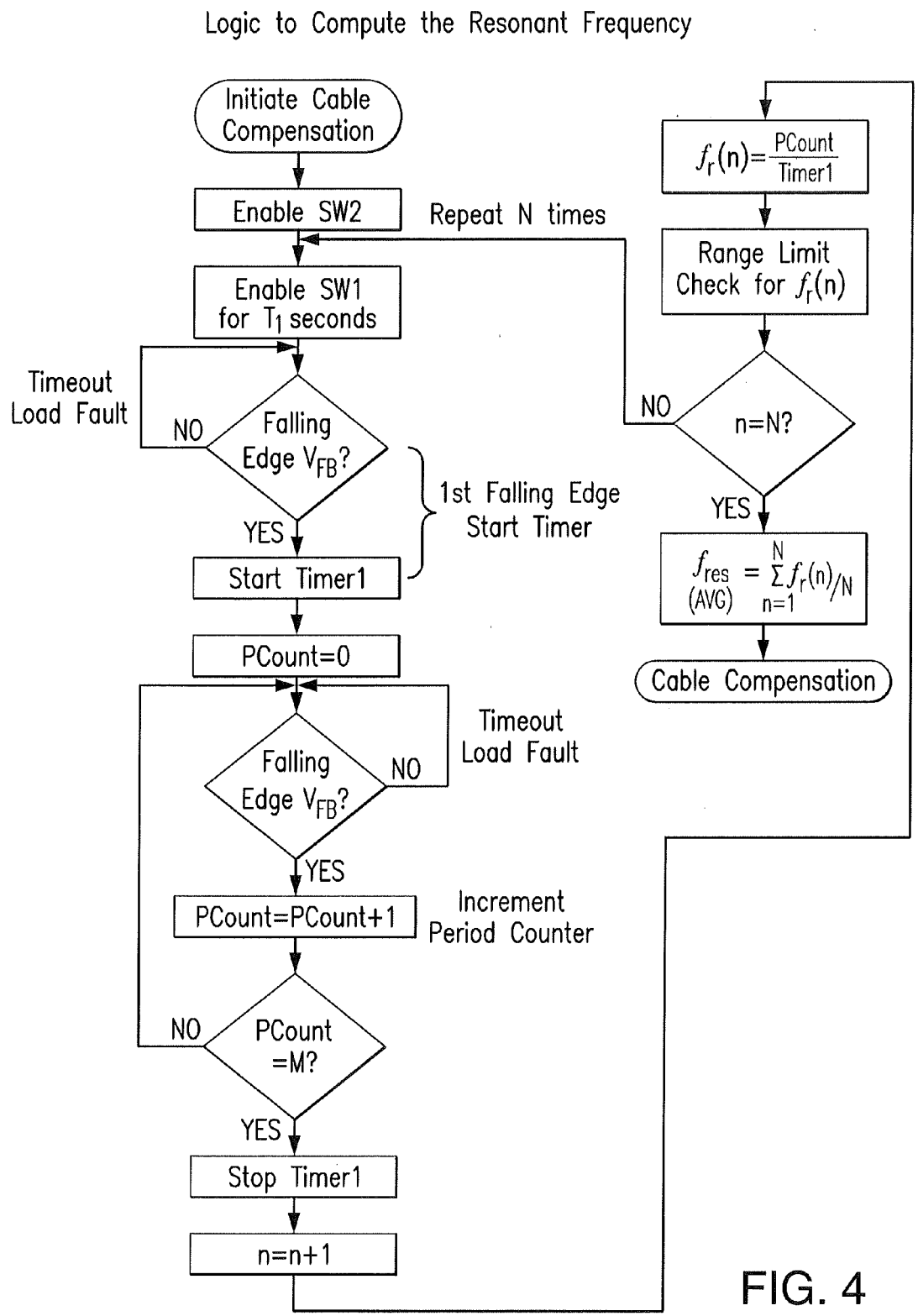
FIG. 4 is a flowchart for the logic used to compensate for cable capacitance in the systems of FIGS. 1 and 2.

Referring now to FIG. 4, the logic for computing resonant frequency is shown as a flow chart. Initiating cable compensation triggers enabling switch, e.g., switch 118. Then switch 102 is enabled for $T_1$ seconds. When a falling edge is detected in the switch enabling signal for the pulsing switch, e.g., switch 102, the timer is started. A timeout to load fault occurs in the absence of a falling edge being detected. Initially, an incremental period count, $P_{count}$, is set to zero. When the next falling edge is detected, $P_{count}$ is increased by one. In the absence of such a falling edge, a timeout to load fault occurs. As long as $P_{count}$ is less than M, the falling edge detection and incrementing of $P_{count}$ continue. Once $P_{count}$ equals M, the timer is stopped. The sample number n is incremented by one, and the frequency for one pulse of the switch is calculated as $P_{count}$ divided by the duration of time when the timer was started and stopped. If sample number n is less than N, the process begins again from enabling the switch for $T_1$ seconds. Once the sample number n is equal to N, a complete number of samples, the frequencies for each pulse are averaged to improve accuracy. The averaged result is used for $f_r$ in calculating $C_{eq}$. While described above in the exemplary context of using falling edges, rising edges can also be used in the manner described above for falling edges.

For noise rejection, logic can optionally be added that throws out samples that lie outside an expected range for the resonant frequency, as indicated by the range limit check for $f_r(n)$ box in FIG. 4. This $f_r$ expected range limit check can be used as a built-in-test (BIT) to verify that $f_r$ is within a reasonable expected tolerance. A sensor load fault error can be set if this range limit fails x times out of N tries, where x is chosen based on the given system. As already noted here, for noise rejection samples (<x) that lie outside an expected range can be thrown away from the average.

If used, for example, in an oil debris monitor using a tuned resonant sensor as in FIG. 1, nominal $L_1$ and $C_1$ values are known. The cable compensation as described above can be performed during power-up initialization and, therefore, prior to oil debris monitoring/processing. The switches 102 and 118 need to be in the off state when monitoring the sensor. It is also contemplated that the cable compensation process need only occur once during initial installation of a system, e.g., sensor, cable, and electronics. For example, it could occur once when the sensor, cable, and electronic control is installed on a gas turbine engine and the results of the cable compensation process can be stored in non-volatile memory within the electronic control for subsequent use on the engine during operation. However, it is also contemplated that the cable compensation process can be executed during each power-up initialization of the electronic control to allow for sensor/cable replacements during the life of the engine, for example.

The systems and methods described herein provide a circuit method to compensate for unknown cabling effects on resonant-based inductive sensors. A potential advantage of these approaches is that a single sensor/system design or part can be used across multiple installations and errors due to different cable types and/or lengths can be compensated for. For example in gas turbine engine systems, a single sensor/system design or part can be used in multiple different engine designs regardless of differing cable lengths in each engine design.

The methods and systems as described above and shown in the drawings, provide for compensation of errors introduced by cable/harness effects with superior properties including compensation for errors where cable type or length changes for different system installations, for example. While the apparatus and methods described herein have been shown and described with reference to preferred embodiments, those skilled in the art will readily appreciate that changes and/or modifications may be made thereto without departing from the scope of this disclosure.

What is claimed is:

1. A system for resonance based cable compensation comprising:
   a first switch with a first terminal for connecting a first connection of a cable having a resonant circuit on an end of the cable opposite the first switch;
   a second terminal for connecting a second connection of a cable that has its first connection connected to the first terminal; and
   a logic component operatively connected to control the first switch to selectively apply voltage pulses across the first and second terminals to generate a resonance signal in a cable connected to the terminals in order to compensate for equivalent cable capacitance.

2. A system as recited in claim 1, further comprising a second switch connecting between the second terminal and the logic component so both switches must be closed to apply voltage pulses across the terminals.

3. A system as recited in claim 1, wherein the logic component includes a switch enabler connected to control the first switch.

4. A system as recited in claim 3, wherein the logic component includes a pulse counter operatively connected to the first terminal to count pulses at the first terminal.

5. A system as recited in claim 4, wherein the logic component includes a timer operatively connected to time output pulses from the switch enabler and feedback pulses from the first terminal.

6. A system as recited in claim 5, further comprising a system processor operatively connected to the logic component and a signal conditioning component operatively connected to the system processor, wherein the system processor and the signal conditioning component are configured and adapted to compensate for cable capacitance in signals from a cable connected to the first and second terminals based on input from the logic component.

7. A system as recited in claim 4, further comprising a comparator operatively connected to the first terminal and pulse counter to convert sinusoidal signal wave forms received at the first terminal into square signal waveforms to be counted by the pulse counter.

8. A resonance based compensated cable system comprising:
   a resonant circuit;
   a cable connected at a first end of the cable to apply a voltage across the resonant circuit; and
   a system as recited in claim 1, wherein the cable is connected at a second cable end to the first and second terminals to apply a voltage across the resonant circuit.

9. A system as recited in claim 8, further comprising a second switch connecting between the second terminal and the logic component so both switches must be closed to apply voltage pulses across the terminals.

10. A system as recited in claim 8, wherein the logic component includes a switch enabler connected to control the first switch.

11. A system as recited in claim 10, wherein the logic component includes a pulse counter operatively connected to the first terminal to count pulses at the first terminal.

12. A system as recited in claim 11, wherein the logic component includes a timer operatively connected to time output pulses from the switch enabler and feedback pulses from the first terminal.

13. A system as recited in claim 12, further comprising a system processor operatively connected to the digital logic component and a signal conditioning component operatively connected to the system processor, wherein the system processor and the signal conditioning component are configured and adapted to compensate for cable capacitance in signals from a cable connected to the first and second terminals based on input from the digital logic component.

14. A system as recited in claim 12, further comprising a system processor operatively connected to the digital logic component and a signal conditioning component operatively connected to the system processor, wherein the system processor and the signal conditioning component are configured and adapted to compensate for cable capacitance in signals from a second cable connected to first and second terminals of the signal conditioning component, based on input from the digital logic component, wherein the second cable is different from the cable connected to the first and second terminals of the system of claim 1.

15. A system as recited in claim 11, further comprising a comparator operatively connected to the first terminal and pulse counter to convert sinusoidal signal wave forms received at the first terminal into square signal waveforms to be counted by the pulse counter.

16. A method of cable compensation comprising:
    applying a pulse across two connections of a first end of a cable having a resonant circuit at a second end of the cable to generate a resonating signal from the connections of the first end of the cable;
    determining cable capacitance based on the resonating signal; and
    processing a sensor signal, compensating for the cable capacitance.

17. A method as recited in claim 16, wherein compensating for the cable capacitance includes adjusting operating frequency for the resonant circuit.

18. A method as recited in claim 16, wherein processing a sensor signal includes processing a sensor signal from the resonant circuit.

19. A method as recited in claim 16, wherein processing a sensor signal includes processing a sensor signal from a sensor connected to a second cable of similar configuration to the cable having the resonant circuit.

20. A method as recited in claim 16, wherein applying a pulse across two connections of a first end of a cable includes periodically applying a pulse to generate the resonating signal periodically for a number of pulses, and wherein determining cable capacitance includes determining an average frequency of the resonating signal for the number of pulses.

\* \* \* \* \*